United States Patent
Oh et al.

(10) Patent No.: US 11,886,293 B2
(45) Date of Patent: Jan. 30, 2024

(54) MEMORY CONTROLLER MANAGING STRONG ERROR INFORMATION AND OPERATING METHOD THEREOF

(71) Applicant: SAMSUNG ELECTRONICS CO., LTD., Suwon-si (KR)

(72) Inventors: Shinho Oh, Yongin-si (KR); Yeongcheol Jo, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/839,369

(22) Filed: Jun. 13, 2022

(65) Prior Publication Data

US 2023/0153201 A1 May 18, 2023

(30) Foreign Application Priority Data

Nov. 15, 2021 (KR) .......................... 10-2021-0157082
Jan. 11, 2022 (KR) .......................... 10-2022-0004333

(51) Int. Cl.
*G11C 29/00* (2006.01)
*G06F 11/10* (2006.01)
*G06F 11/07* (2006.01)

(52) U.S. Cl.
CPC ........ *G06F 11/1068* (2013.01); *G06F 11/076* (2013.01); *G06F 11/0772* (2013.01)

(58) Field of Classification Search
CPC . G06F 11/1068; G06F 11/0772; G06F 11/076
See application file for complete search history.

(56) References Cited

U.S. PATENT DOCUMENTS

| 9,009,574 B2 | 4/2015 | Chilappagari et al. |
| 9,250,990 B2 | 2/2016 | Motwani et al. |
| 9,397,703 B2 | 7/2016 | Ghaly et al. |
| 9,431,122 B2 | 8/2016 | Lee |

(Continued)

FOREIGN PATENT DOCUMENTS

| KR | 10-0955157 B1 | 4/2010 |
| KR | 10-2015-0074655 | 7/2015 |

(Continued)

OTHER PUBLICATIONS

Korean Notice of Allowance dated Dec. 1, 2022, Cited in Corresponding KR Patent Application No. 10-2022-0004333.
European Search Report dated Apr. 3, 2023, Cited in EP Patent Application No. 22191565.5.

*Primary Examiner* — Samir W Rizk
(74) *Attorney, Agent, or Firm* — Fish & Richardson P.C.

(57) ABSTRACT

A method of operating a memory controller includes: collecting hard decision information based on data read from memory cells of a monitoring unit using a normal read level; collecting soft decision information based on data read from the monitoring unit using one or more offset read levels that are different from the normal read level; storing first strong error information determined based on the hard decision information and the soft decision information in a memory in the memory controller; and updating second strong error information determined for the monitoring unit in the memory after the first strong error information is stored. The second strong error information is used to correct an error in data read in response to a read request from a host.

20 Claims, 19 Drawing Sheets

(56) References Cited

U.S. PATENT DOCUMENTS

| | | |
|---|---|---|
| 9,442,797 B2 | 9/2016 | Shin |
| 9,519,576 B2 | 12/2016 | Seo et al. |
| 9,524,208 B2 | 12/2016 | Kim et al. |
| 10,152,380 B2 | 12/2018 | Yim et al. |
| 10,324,785 B2 | 6/2019 | Kim et al. |
| 10,572,158 B2 | 2/2020 | Lee et al. |
| 10,573,393 B1 | 2/2020 | Peng et al. |
| 11,114,174 B2 | 9/2021 | Oh et al. |
| 11,133,069 B2 | 9/2021 | Kim |
| 11,361,832 B2 | 6/2022 | Han et al. |
| 2007/0033488 A1 | 2/2007 | Brueggen |
| 2010/0235713 A1 | 9/2010 | Lee et al. |
| 2013/0132804 A1 | 5/2013 | Frayer et al. |
| 2014/0185377 A1* | 7/2014 | Kim ................. G11C 16/26 |
| | | 365/185.03 |
| 2015/0178154 A1* | 6/2015 | Kim ................. G06F 11/1012 |
| | | 714/773 |
| 2016/0350179 A1* | 12/2016 | Lin ................. G06F 11/1012 |

FOREIGN PATENT DOCUMENTS

| | | |
|---|---|---|
| KR | 10-2015-0075170 | 7/2015 |
| KR | 10-2017-0120442 | 10/2017 |
| KR | 10-2018-0009558 | 1/2018 |
| KR | 10-2021-0020689 | 8/2019 |
| KR | 10-2020-0037692 | 4/2020 |
| KR | 10-2128406 | 6/2020 |
| KR | 10-2021-0083466 | 7/2021 |

\* cited by examiner

< PLC Distribution >

MEMORY CONTROLLER MANAGING STRONG ERROR INFORMATION AND OPERATING METHOD THEREOF

CROSS-REFERENCE TO RELATED APPLICATIONS

This application is based on and claims priority under 35 U.S.C. § 119 to Korean Patent Application No. 10-2021-0157082, filed on Nov. 15, 2021, in the Korean Intellectual Property Office and Korean Patent Application No. 10-2022-0004333, filed on Jan. 11, 2022, in the Korean Intellectual Property Office, the disclosures of which are incorporated herein in their entireties by reference.

BACKGROUND

The disclosure relates to a memory controller and, more particularly, to a memory controller that manages strong error information and an operating method thereof.

As a nonvolatile memory, a flash memory may retain stored data even when power thereto is cut off. As a memory system, a flash memory system (or a storage device) including a flash memory, such as a solid-state drive (SSD), and a memory card is widely used. The storage device is usefully used to store or move a large amount of data.

Because the storage capacity of the flash memory increases and the number of bits stored per each memory cell increases, the number of threshold voltage distributions of the memory cells may increase. For example, when each memory cell stores data of 4 bits or 5 bits or more, the interval between threshold voltage distributions of the memory cells becomes very narrow, and accordingly, the number of errors generated per certain unit (e.g., error correction unit) may increase. In particular, when the number of memory cells having a strong error increases as the level of the threshold voltage changes relatively significantly, error correction is impossible and, thus, data reliability may be deteriorated.

SUMMARY

The disclosure provides a memory controller capable of improving data reliability by periodically or aperiodically monitoring strong error information and correcting data errors based on this, and an operating method thereof.

According to an aspect of the disclosure, there is provided a method of operating a memory controller including: collecting hard decision information based on data read from memory cells of a monitoring unit using a normal read level; collecting soft decision information based on data read from the monitoring unit using one or more offset read levels that are different from the normal read level; storing first strong error information determined based on the hard decision information and the soft decision information in a memory in the memory controller; and updating second strong error information determined for the monitoring unit in the memory after the first strong error information is stored. The second strong error information is used to correct an error in data read in response to a read request from a host.

According to another aspect of the disclosure, there is provided a method of operating a memory controller including: collecting hard decision information based on data read from memory cells using a normal read level; collecting soft decision information based on data read from the memory cells using one or more offset read levels that are different from the normal read level; storing first strong error information determined based on the hard decision information and the soft decision information in a memory in the memory controller; as an uncorrectable error occurs in data read in response to a read request from a host, generating second strong error information based on the hard decision information and the soft decision information collected by re-reading the memory cells; and correcting an error in data read in response to the read request using the first strong error information and the second strong error information.

According to another aspect of the disclosure, there is provided a memory controller including: a processor configured to control a memory operation for a memory device; an error correcting code (ECC) circuit configured to perform an error correction operation on data read from the memory device, to generate first strong error information based on hard decision information collected using a normal read level for a monitoring unit of the memory device and soft decision information collected using one or more offset read levels, and to generate second strong error information based on the hard decision information and the soft decision information collected again for the monitoring unit in response to a read request from a host; and a volatile memory configured to store the first strong error information or the second strong error information. The normal read level and the offset read levels have different values, and the ECC circuit corrects an error of data requested to be read from the host by using the first strong error information and the second strong error information.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Hereinafter, embodiments of the disclosure will be described in detail with reference to the accompanying drawings.

Figure 1:
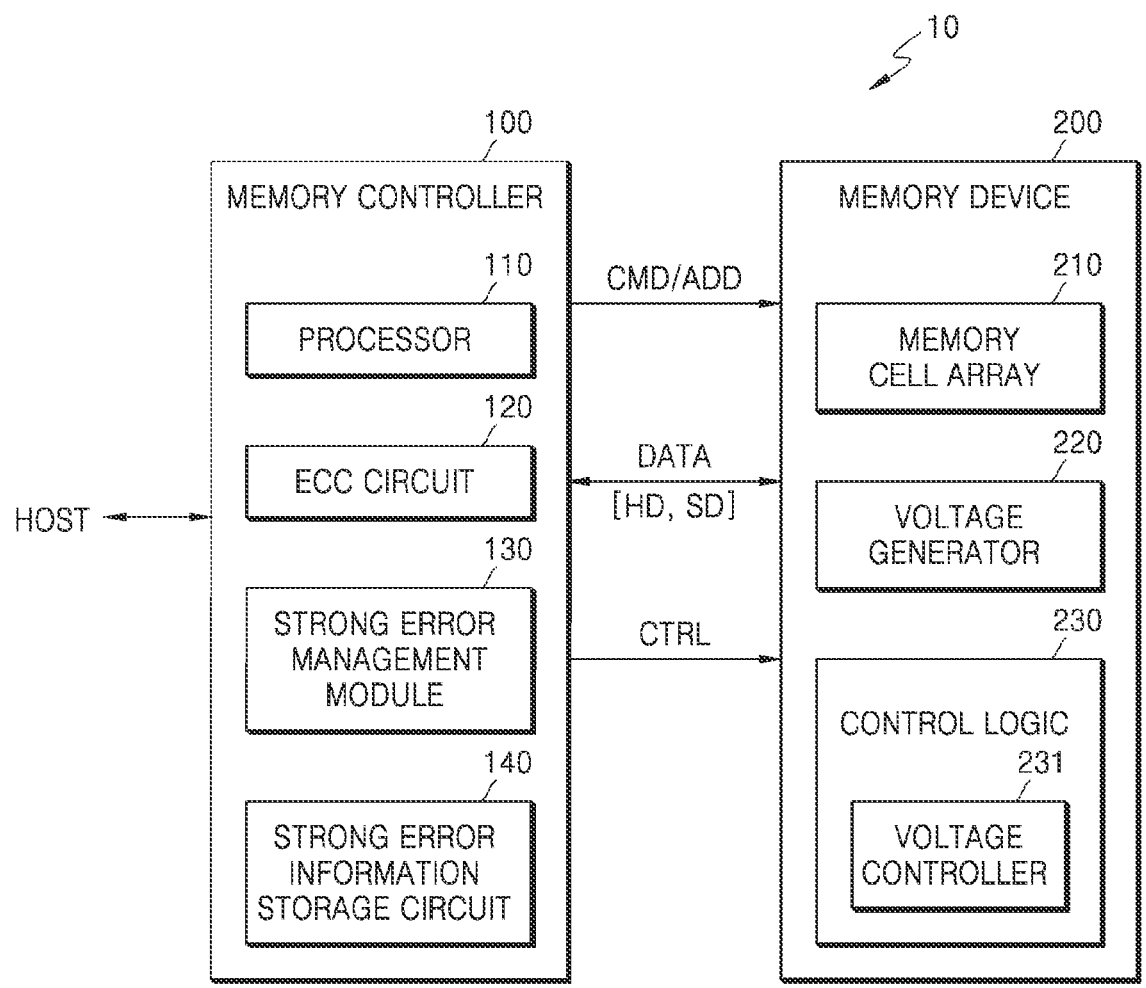
FIG. 1 is a block diagram illustrating a memory system according to an embodiment.

FIG. 1 is a block diagram illustrating a memory system according to an embodiment.

Referring to FIG. 1, a memory system 10 may include a memory controller 100 and a memory device 200, the memory device 200 may include a memory cell array 210, a voltage generator 220, and control logic 230, and the control logic 230 may include a voltage controller 231. In the example of FIG. 1, the voltage controller 231 is illustrated as being provided in the control logic 230, but the voltage controller 231 according to the embodiment may be implemented as a separate component outside the control logic 230.

For example, the memory system 10 may communicate with a host through various interfaces and, as an example, may communicate with a host through various interfaces such as a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a firewire interface, a universal flash storage (UFS) interface, a nonvolatile memory express (NVMe) interface, and the like.

According to an embodiment, the memory device 200 may include a nonvolatile memory device, such as a flash memory. In some embodiments, the memory system 10 may be implemented as an embedded or removable memory in an electronic device and may be implemented in various forms such as, for example, an embedded universal flash storage (UFS) memory device, an embedded multi-media card (eMMC), a solid state drive (SSD), a UFS memory card, a compact flash (CF) card, a secure digital (SD) card, a micro secure digital (micro-SD) card, a mini secure digital (mini-SD) card, an extreme digital (xD) card, or a memory stick. In addition, the memory system 10 may be referred to as a storage device as the memory system 10 stores data in a nonvolatile manner.

The memory controller 100 reads data stored in the memory device 200 in response to a write/read request from a host HOST or may control the memory device 200 to write data to the memory device 200. For example, the memory controller 100 includes a processor 110 and the processor 110 may control all internal operations of the memory controller 100 and may control a memory operation performed on the memory device 200. In more detail, the memory controller 100 may control write, read, and erase operations performed on the memory device 200 by providing an address ADD, a command CMD, and a control signal CTRL to the memory device 200. In addition, data DATA to be stored in the memory device 200 and data DATA read from the memory device 200 may be transmitted/received between the memory controller 100 and the memory device 200.

The memory cell array 210 may include a plurality of memory cells, and for example, the plurality of memory cells may be flash memory cells. Hereinafter, embodiments will be described with reference to a case in which the plurality of memory cells are NAND flash memory cells as an example. However, the disclosure is not limited thereto, and in some embodiments, the plurality of memory cells may be resistive memory cells, such as resistive RAM (ReRAM) memory cells, phase change RAM (PRAM) memory cells, or magnetic RAM (MRAM) memory cells.

In an embodiment, the memory cell array 210 may include a 3D memory cell array and the 3D memory cell array may include a plurality of NAND strings, wherein each NAND string may include memory cells respectively connected to word lines stacked vertically on a substrate. However, the disclosure is not limited thereto and, in some embodiments, the memory cell array 210 may include a 2D memory cell array, wherein the 2D memory cell array may include a plurality of NAND strings arranged in row and column directions.

Because a read command is provided from the memory controller 100 to the memory device 200, a read operation may be performed based on the control by the control logic 230. For example, when each memory cell stores a plurality of bits, memory cells of the memory cell array 210 may include a plurality of threshold voltage distributions and data including two or more bits may be read from each memory cell.

The voltage generator 220 may generate various voltages used in the memory device 200, and as an example, may generate a program voltage for a program operation and a read voltage for a read operation. In addition, the voltage generator 220 may variously adjust levels of the program voltage and the read voltage based on the control by the control logic 230. For example, the voltage generator 220 may provide read voltages having various levels to determine a plurality of threshold voltage distributions. In addition, in determining the distribution of any one threshold voltage, a read operation using one or more read levels may be performed. According to an embodiment, a read voltage having a voltage level for collecting hard decision data and a read voltage having a voltage level for collecting soft decision data may be provided. For example, soft decision data may be collected by reading data using a read voltage having a level to which a certain offset is applied, compared to the level of the read voltage for collecting the hard decision data.

In addition, in an embodiment, a level of a read voltage for collecting hard decision data may correspond to a read level in a normal read operation performed according to a request of a host. In the embodiment below, a level related to hard decision information collection is referred to as a normal read level and a level related to soft decision information collection is referred to as an offset read level. In addition, hard decision data may be referred to as hard decision information and soft decision data may be referred to as soft decision information.

The control logic 230 may control all operations of the memory device 200 and may output various internal control signals for programming data into or reading data from the memory cell array 210 based on, for example, the command CMD, the address ADD, and the control signal CTRL received from the memory controller 100. In addition, the control logic 230 may output a voltage control signal (not shown) for adjusting levels of various voltages output from the voltage generator 220 in connection with a program operation, a read operation, and an erase operation.

According to an embodiment, when an error is detected in the data read from the memory cell array 210 or an uncorrectable error occurs, the memory controller 100 may perform a recovery algorithm for recovering the data error. For example, the memory controller 100 may perform various types of recovery algorithms, and in an embodiment, may select an optimal recovery algorithm for recovering an error according to strong error information determined based on the hard decision information and soft decision information described above.

According to an embodiment, the memory controller 100 may periodically or aperiodically perform strong error monitoring (or degradation status monitoring) regardless of a request from a host. For example, a certain unit of the memory cell array 210 may be defined as a monitoring unit, and the memory controller 100 may control a read operation for memory cells of the monitoring unit and collect strong error information for the monitoring unit based on hard decision information and soft decision information for the monitoring unit. For example, a group sharing reliability information (e.g., strong error information) with each other when performing a recovery algorithm may be set as the monitoring unit.

A detailed operation example in an embodiment will be described as follows.

The memory controller 100 may include an error correcting code (ECC) circuit 120, a strong error management module 130, and a strong error information storage circuit 140. The ECC circuit 120 may perform an error correction operation, based on a certain error correction algorithm, on data read from the memory device 200. For example, as the ECC circuit 120 performs error correction based on a low density parity check (LDPC), the ECC circuit 120 may collect hard decision information and soft decision information according to data read based on a reading level and an offset read level and may determine or collect strong error information indicating the location of a memory cell in which a strong error has occurred based thereon. When performing error correction based on LDPC, the ECC circuit 120 may calculate coefficients for each memory cell (or for each bit) using hard decision information and soft decision information and may perform an error correction operation through arithmetic processing using the calculated coefficients.

The strong error management module 130 may perform various management operations based on the strong error information. For example, the strong error management module 130 may determine the degree of deterioration of the memory device 200, based on the strong error information, and may perform a management operation so that collected strong error information is used for error correction of data read according to a request from a host. In addition, the strong error management module 130 may perform a management operation so that the collected strong error information is updated in the strong error information storage circuit 140 and may perform a management operation, such as determining whether to perform a read reclaim or selecting an optimal recovery algorithm for error recovery based on the amount of strong errors.

On the other hand, the strong error information storage circuit 140 may store strong error information collected from a plurality of monitoring units and the strong error information may be updated based on the control by the strong error management module 130. The strong error information storage circuit 140 may include various types of memory and may include, for example, dynamic random access memory (DRAM) as a volatile memory. The strong error information storage circuit 140 may store location information of a memory cell having a strong error in each monitoring unit as the strong error information. Because the degree of deterioration of the memory device 200 increases over time and thus the amount of strong errors increases or the locations of memory cells having the strong error change, the strong error information stored in the information storage circuit may be updated.

As the number of bits stored by each memory cell of a memory device such as NAND increases, data reliability may deteriorate. According to an embodiment as described above, because strong error information is periodically or aperiodically collected and updated and the updated strong error information may be used for error correction, data reliability may be increased by improving an error correction capability. In addition, because it is possible to select an optimal recovery algorithm or determine whether to perform a read reclaim based on the periodically or aperiodically collected strong error information, the time required for a recovery operation for error recovery may be reduced. In addition, because the timing of performing the read reclaim may be optimally determined, the problem of data loss may be reduced.

Although the embodiment described above shows that the function of the strong error management module 130 is implemented outside the ECC circuit 120, the embodiment is not limited thereto, and the strong error management function may be implemented within the ECC circuit 120. In addition, although the strong error management module 130 is shown as a separate functional block in the memory controller 100, the strong error management module 130 may be implemented in software and loaded into a working memory (not shown) in the memory controller 100 to be executed. In an embodiment, when the memory system 10 is a flash memory system, the memory controller 100 may include a flash translation layer FTL including firmware and the strong error management module 130 may be included in the flash translation layer FTL.

Figure 2:
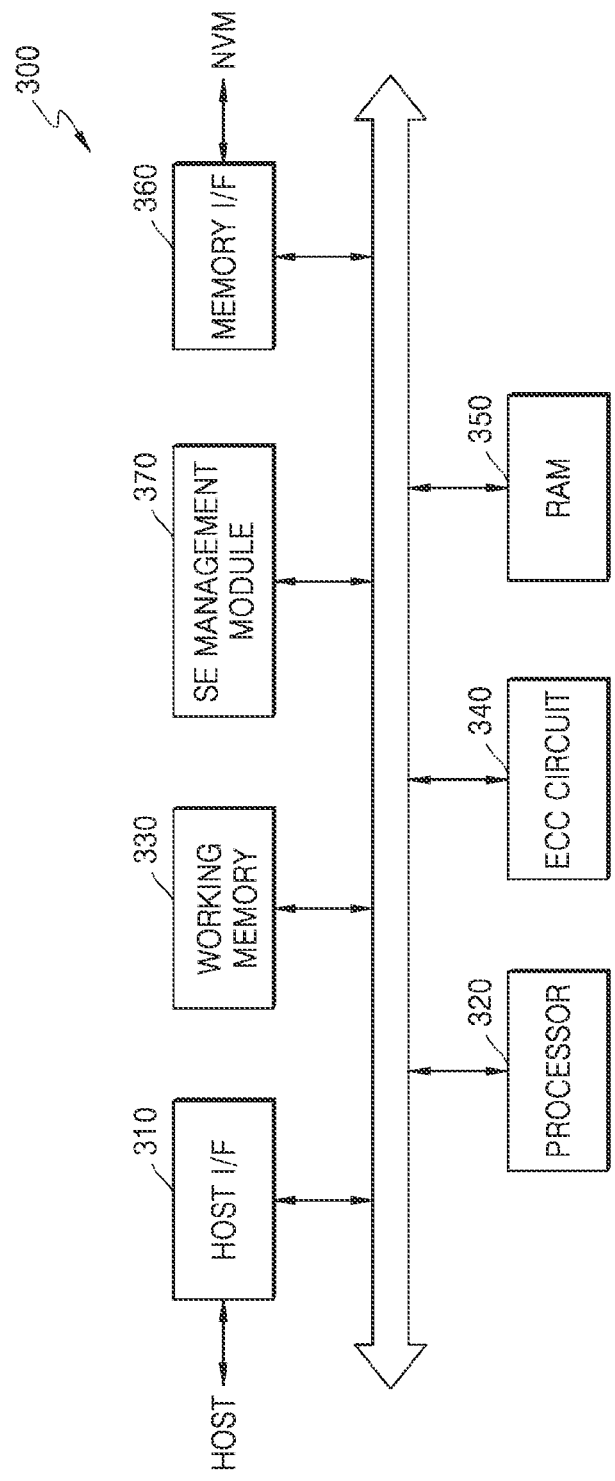
FIG. 2 is a block diagram illustrating an implementation example of a memory controller according to an embodiment.

FIG. 2 is a block diagram illustrating an implementation example of a memory controller according to an embodiment.

Referring to FIG. 2, a memory controller 300 may include a host interface 310, a processor 320, a working memory 330, an ECC circuit 340, RAM 350, a memory interface 360, and a strong error management module 370. The processor 320 may control all operations of the memory controller 300 by executing firmware loaded into the working memory 330. The working memory 330 and the RAM 350 may be implemented with various types of memory and, for example, may be implemented with at least one of a cache memory, DRAM, SRAM, PRAM, and MRAM. In addition, as an example of firmware, the flash translation layer FTL may be loaded into the working memory 330 and various functions related to a flash memory operation may be performed by driving the flash translation layer FTL.

The host interface 310 may communicate with the host through various types of interfaces according to the embodiment described above. In addition, the memory interface 360 provides a physical connection between the memory controller 300 and a memory device (e.g., a nonvolatile memory device NVM). For example, a command/address and data may be transmitted/received between the memory controller 300 and the nonvolatile memory device NVM through the memory interface 360.

The RAM 350 may store various types of information volatile. For example, data requested to be written by a host and data read from the nonvolatile memory device NVM may be temporarily stored in the RAM 350. In addition, according to an embodiment, strong error information collected through strong error monitoring may be stored in the RAM 350.

The ECC circuit 340 may perform ECC encoding processing on data requested to be written and may perform decoding processing on read data. According to an embodiment, the ECC circuit 340 may receive hard decision information and soft decision information and generate strong error information based thereon. In addition, the strong error management module 370 may perform various management operations based on strong error information and may manage an operation of updating the strong error information, an operation of selecting a recovery algorithm based on a determination of the strong error information, an operation of determining whether a read reclaim is made, and the like according to the embodiment described above.

Figure 3:
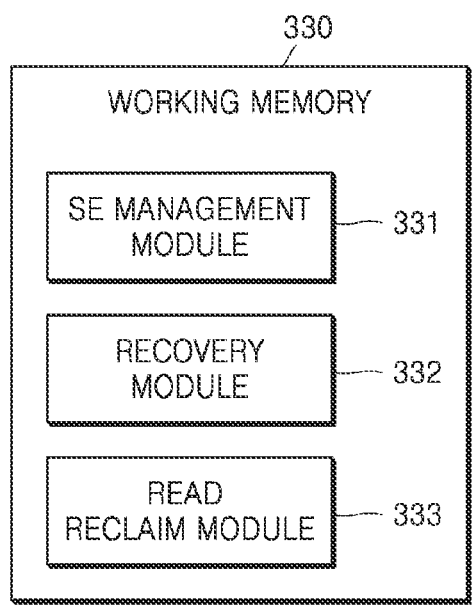
FIG. 3 is a block diagram illustrating an example in which a strong error management operation of an embodiment is performed by software.

FIG. 3 is a block diagram illustrating an example in which a strong error management operation of an embodiment is performed by software.

Referring to FIG. 3, the strong error management function, the recovery function, and the read reclaim function in the embodiment described above may be implemented in software as firmware. According to an implementation example, the strong error management function may be implemented by software of a strong error management module 331, functions of various types of recovery algorithms may be implemented by software of a recovery module 332, and the read reclaim function may be implemented by a read reclaim module 333. The strong error management module 331, the recovery module 332, and the read reclaim module 333 may be loaded into the working memory 330, and the processor 320 illustrated in FIG. 2 may execute various types of software loaded into the working memory 330.

Figure 4:
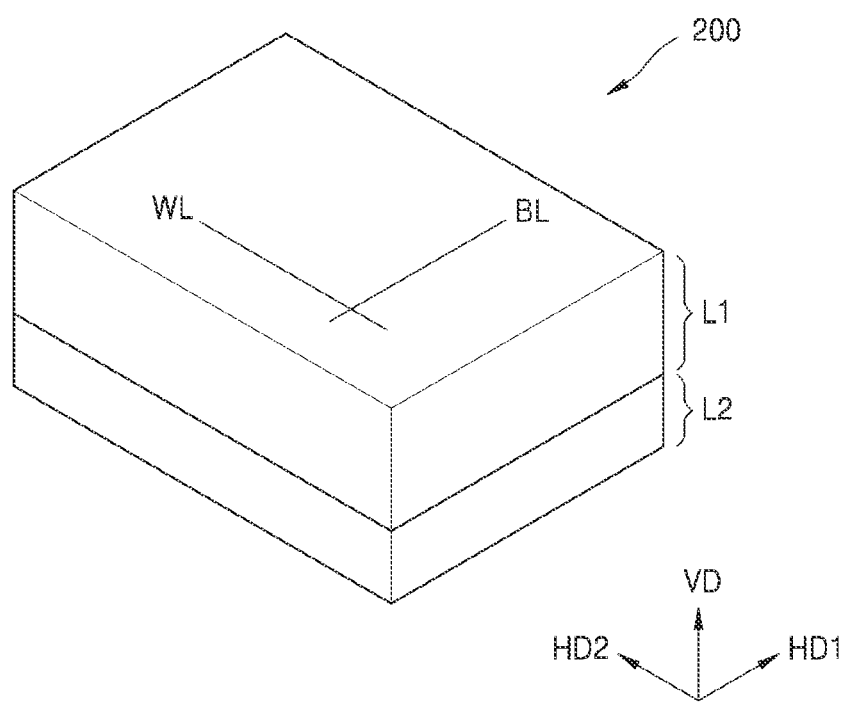
FIG. 4 is a view schematically illustrating a structure of a memory device of FIG. 1 according to an embodiment.
Figure 5:
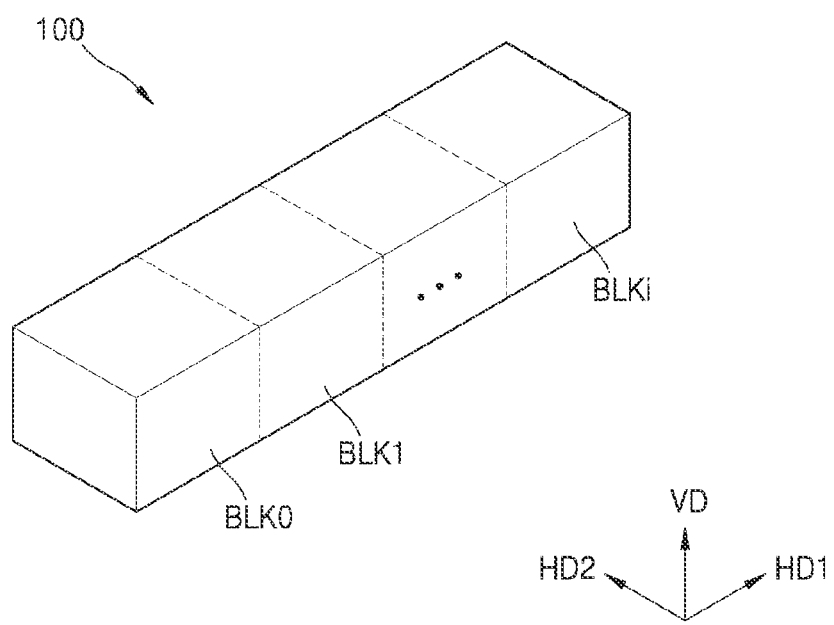
FIG. 5 is a view illustrating the memory cell array of FIG. 1 as an example.
Figure 6:
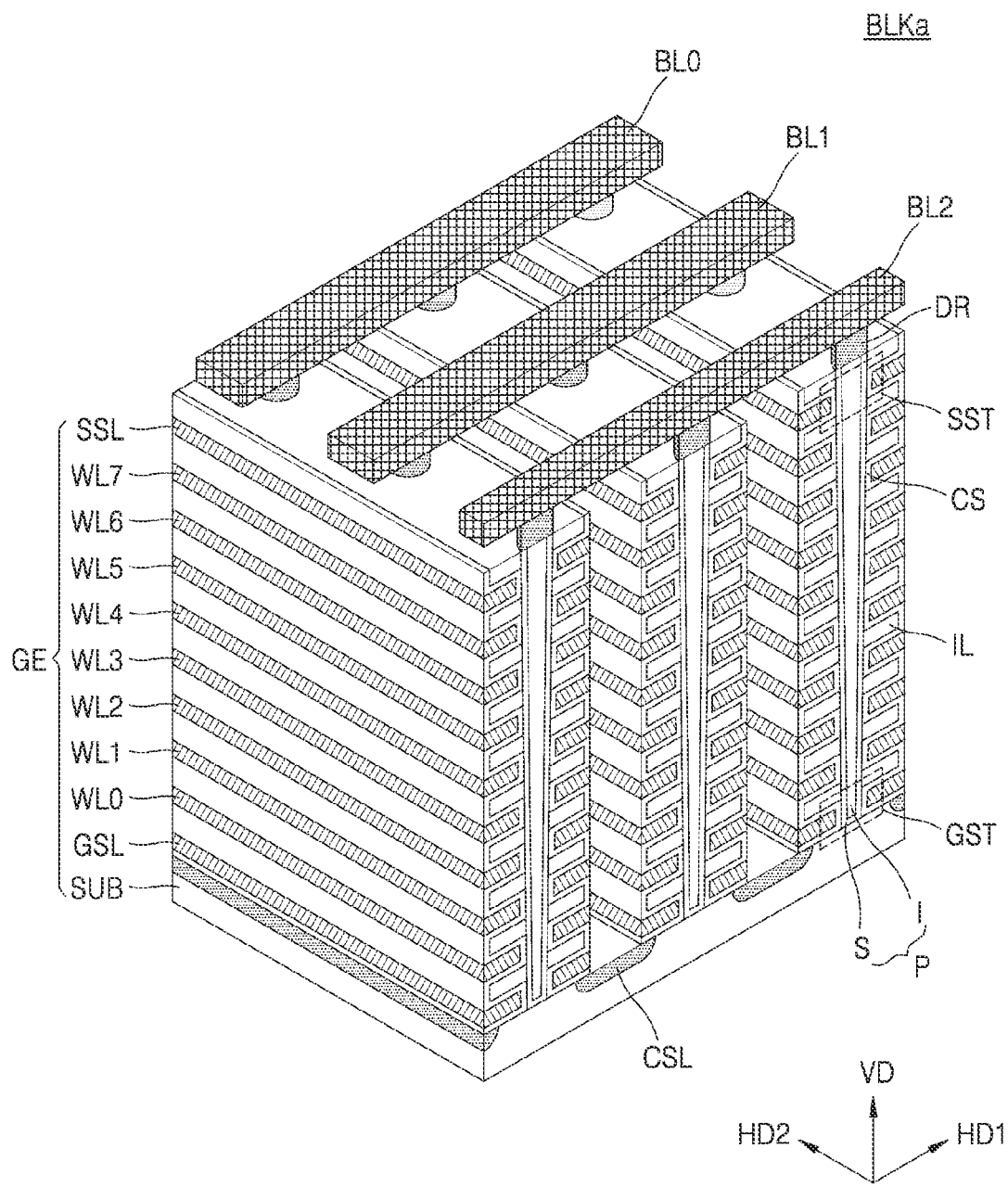
FIG. 6 is a perspective view illustrating an example of a structure of a memory block of FIG. 5.

FIG. 4 is a view schematically illustrating a structure of the memory device of FIG. 1 according to an embodiment, FIG. 5 is a view illustrating the memory cell array of FIG. 1 as an example, and FIG. 6 is a perspective view illustrating an example of a structure of a memory block (or a memory block) of FIG. 5. In FIG. 4, a cell over periphery (COP) structure is exemplified as an embodiment of the memory device, but embodiments are not limited thereto, and the memory device may be implemented through various structures.

Referring to FIG. 4, the memory device 200 may include a first semiconductor layer L1 and a second semiconductor layer L2, wherein the first semiconductor layer L1 may be stacked in a vertical direction VD with respect to the second semiconductor layer L2. In more detail, the second semiconductor layer L2 may be disposed below the first semiconductor layer L1 in the vertical direction VD, and thus the second semiconductor layer L2 may be disposed close to a substrate.

In an embodiment, the memory cell array of FIG. 1 may be formed in the first semiconductor layer L1, and other peripheral circuits of FIG. 1 may be formed in the second semiconductor layer L2. Accordingly, the memory device 200 may have a structure in which a memory cell array is disposed on top of a peripheral circuit, that is, a COP structure. The COP structure may effectively reduce a horizontal area and improve the degree of integration of the memory device 200.

In an embodiment, the second semiconductor layer L2 may include a substrate and a peripheral circuit may be formed in the second semiconductor layer L2 by forming transistors and metal patterns for wiring the transistors on the substrate. After the peripheral circuit is formed in the second semiconductor layer L2, the first semiconductor layer L1 including a memory cell array may be formed, and metal patterns for electrically connecting word lines WL and bit lines BL of the memory cell array to the peripheral circuit formed in the second semiconductor layer L2 may be formed. The bit lines BL may extend in a first horizontal direction HD1, and the word lines WL may extend in a second horizontal direction HD2.

However, referring to FIG. 5, the memory cell array may include a plurality of cell blocks BLK0 to BLKi, wherein i may be a positive integer. Each of the plurality of cell blocks BLK0 to BLKi may have a three-dimensional structure (or a vertical structure). In more detail, each of the plurality of cell blocks BLK0 to BLKi may include a plurality of NAND strings extending in the vertical direction VD. In this case, the plurality of NAND strings may be provided to be apart from each other by a specific distance in the first and second horizontal directions HD1 and HD2. The plurality of cell blocks BLK0 to BLKi may be selected by a row decoder (not shown) of the memory device. For example, the row decoder may select a cell block corresponding to a block address from among the plurality of cell blocks BLK0 to BLKi.

On the other hand, referring to FIG. 6, the cell block BLKa is formed in a direction perpendicular to a substrate SUB. The substrate SUB has a first conductivity type (e.g., a p-type) and extends in the second horizontal direction HD2 and is provided with a common source line CSL doped with impurities of a second conductivity type (e.g., an n-type). A plurality of insulating layers IL extending in the second horizontal direction HD2 are sequentially provided in the vertical direction VD in an area of the substrate SUB between two adjacent common source lines CSL, and the plurality of insulating layers IL are apart from each other by a certain distance in the vertical direction VD. For example, the plurality of insulating layers IL may include an insulating material, such as a silicon oxide.

A plurality of pillars P arranged sequentially in the first horizontal direction HD1 and passing through the plurality of insulating layers IL in the vertical direction VD are provided in the area of the substrate SUB between the two adjacent common source lines CSL. For example, the plurality of pillars P may penetrate the plurality of insulating layers IL and contact the substrate SUB. In more detail, a surface layer S of each pillar P may include a first type of silicon material and may function as a channel area. An inner layer I of each pillar P may include an insulating material, such as a silicon oxide, or an air gap.

In an area between the two adjacent common source lines CSL, a charge storage layer CS is provided along exposed surfaces of the insulating layers IL, the pillars P, and the substrate SUB. The charge storage layer CS may include a gate-insulating layer (referred to as a tunneling insulating layer), a charge trap layer, and a blocking insulating layer. For example, the charge storage layer CS may have an oxide-nitride-oxide (ONO) structure. In addition, in the area between the two adjacent common source lines CSL, a gate electrode GE including selection lines GSL and SSL and word lines WL0 to WL7 is formed on an exposed surface of the charge storage layer CS.

Drains or drain contacts DR are provided on the plurality of pillars P, respectively. For example, the drains or drain contacts DR may include a silicon material doped with impurities of a second conductivity type. Bit lines BL0 to BL2 extending in the first horizontal direction HD1 and apart from each other by a certain distance in the second horizontal direction HD2 are provided on the drains or drain contacts DR. Additionally, cell block BLKa includes string selection transistors SST and ground selection transistors GST.

Figure 7A:
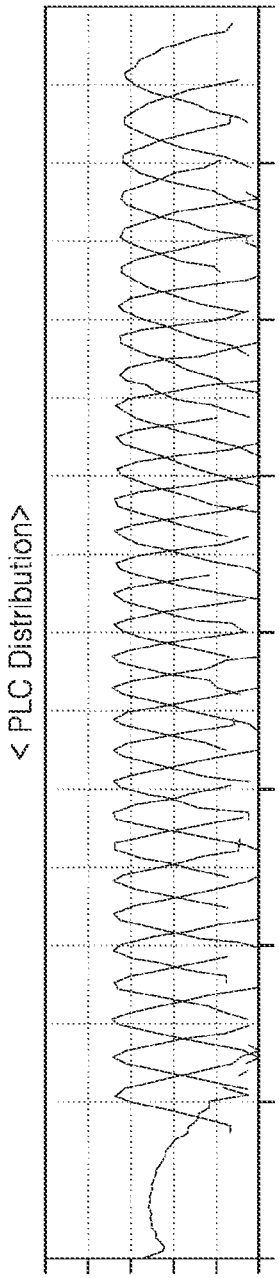
FIGS. 7(A) and 7(B) illustrate an example of a case where data of 5 bits per memory cell is stored and a strong error exists.
Figure 7B:
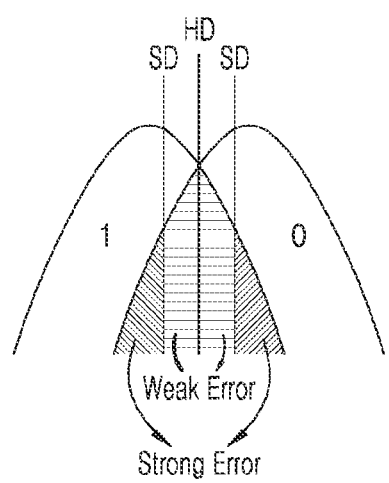

FIGS. 7(A) and 7(B) illustrate an example of a case where data of 5 bits per memory cell is stored and a strong error exists.

Referring to FIGS. 7(A) and 7(B), in a flash memory, as the number of bits stored by each memory cell increases, the number of threshold voltage distributions of the memory cells may increase. When a memory cell is a quad-level cell (QLC) that stores 4-bit data or a penta-level cell (PLC) that stores 5-bit data, the interval between threshold voltage distributions may be very narrow. FIG. 7(A) shows a case where the number of threshold voltage distributions of memory cells is 32 for a PLC, and FIG. 7(B) shows an example of a strong error in two adjacent threshold voltage distributions.

The error may increase as the interval between the threshold voltage distributions narrows. In particular, because the strong error is an error that is generated at a location (e.g., a location of a threshold voltage level) that is expected to have strong reliability, correction power may be greatly weakened during an error correction operation based on LDPC, etc. In addition, as the number of memory cells having the strong error increases, the correction power may be further weakened. For example, in the threshold voltage distributions shown in FIG. 7(B), in a case of memory cells corresponding to the hatched area on the left, it may be reliable to have data of "1", but in reality, a threshold voltage level of memory cells storing data of "0" is greatly changed. An increase in the number of memory cells having the strong error as described above may cause a problem in which an error correction capability is deteriorated.

On the other hand, referring to FIG. 7(B), a memory controller may receive data read through a normal read level as hard decision information HD in order to collect strong error information and may receive data read through an offset read level as soft decision information SD. The offset read level may include a first offset read level that is less by a first offset than the normal read level and a second offset read level that is greater than the normal read level by a second offset. The memory controller may receive data read using the first offset read level and the second offset read level as the soft decision information SD, respectively. In addition, the first offset and the second offset may be the same or different.

The collection of the hard decision information HD and the soft decision information SD for generating the strong error information may be performed based on various methods. For example, in a periodic or aperiodic monitoring operation according to an embodiment, strong error information may be generated by further collecting the soft decision information SD regardless of whether error correction is possible based on the hard decision information HD. Alternatively, strong error information may be generated by determining whether error correction is possible based on the hard decision information HD and selectively reading the soft decision information SD when error correction is impossible.

On the other hand, when strong error information is generated in response to a read request from a host, an error correction operation is performed on data read through a normal read operation, and when error correction is impossible, strong error information may be selectively generated. For example, a memory controller (or a memory system) may generate strong error information in a monitoring unit including a read unit requested to be read by a host and collect the hard decision information HD and the soft decision information SD based on the normal read level and the offset read level separately from the previously performed normal read operation. Alternatively, in various embodiments, the memory controller uses data read through the normal read operation as the hard decision information HD and may further perform only a read operation using the offset read level to collect the soft decision information SD.

In the example of FIG. 7(B), memory cells in which a change in the threshold voltage level does not exceed an offset may be defined as having a weak error, whereas memory cells in which a change in the threshold voltage level exceeds the offset are defined as having a strong error. When error correction is performed based on LDPC, various parameters, such as coefficients used for an error correction operation, may be calculated based on characteristics of memory cells (e.g., a strong error, a weak error, etc.). When a memory cell having an actual strong error is erroneously determined to be a memory cell having strong reliability, the error correction capability may be deteriorated. According to the embodiment described above, an increase in the number of memory cells having a strong error is a factor that further deteriorates the error correction capability.

According to an embodiment, the memory system may periodically or aperiodically perform strong error monitoring regardless of a read request from a host. In addition, memory cells having a strong error may fluctuate or increase with time and by updating strong error information, locations of the memory cells having a strong error may be accurately determined. Accordingly, by performing a recovery algorithm based on the periodically/aperiodically updated strong error information, parameters used for ECC decoding processing, such as LDPC, may be accurately calculated (or compensated for) and an error correction capability may be improved. In addition, the memory system determines the number (or degree of deterioration) of memory cells having a strong error periodically or aperiodically through strong error monitoring and determines whether a read reclaim is made based on the number of memory cells, so that a management operation for data reliability may be performed in advance before data is lost.

Figure 8A:
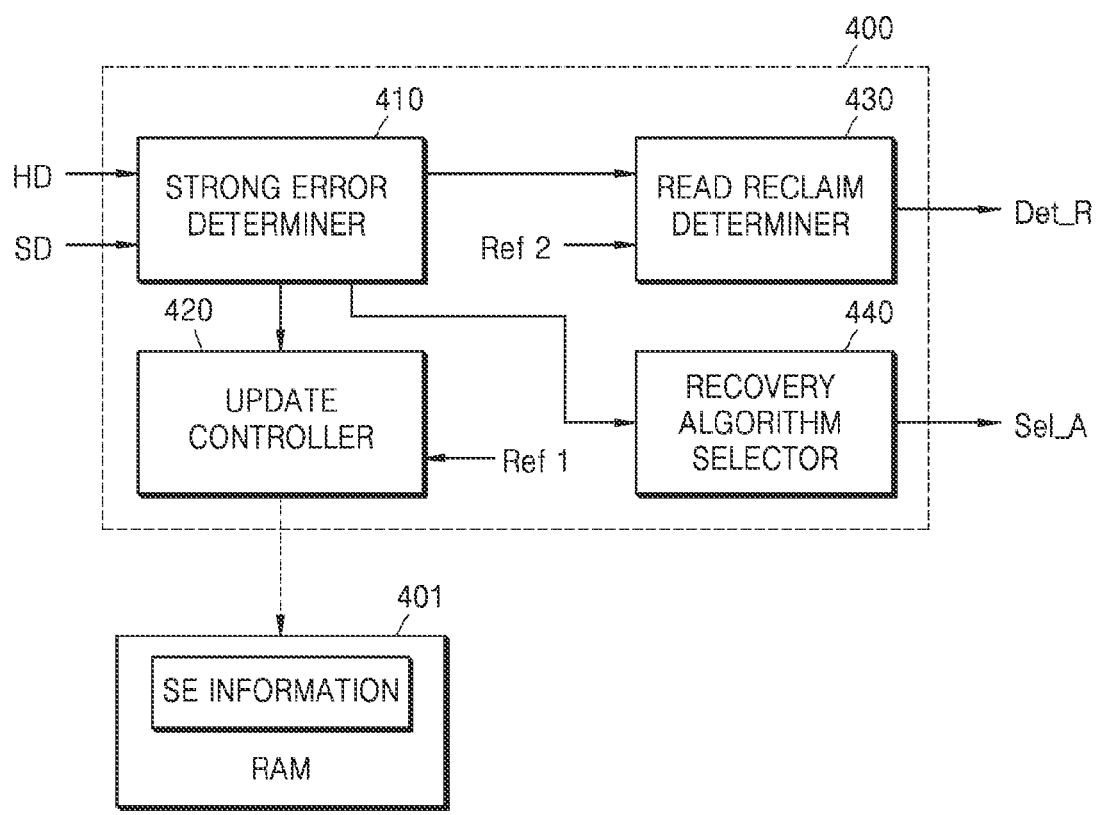
FIGS. 8A and 8B illustrate an implementation example of a strong error management module of the disclosure.
Figure 8B:
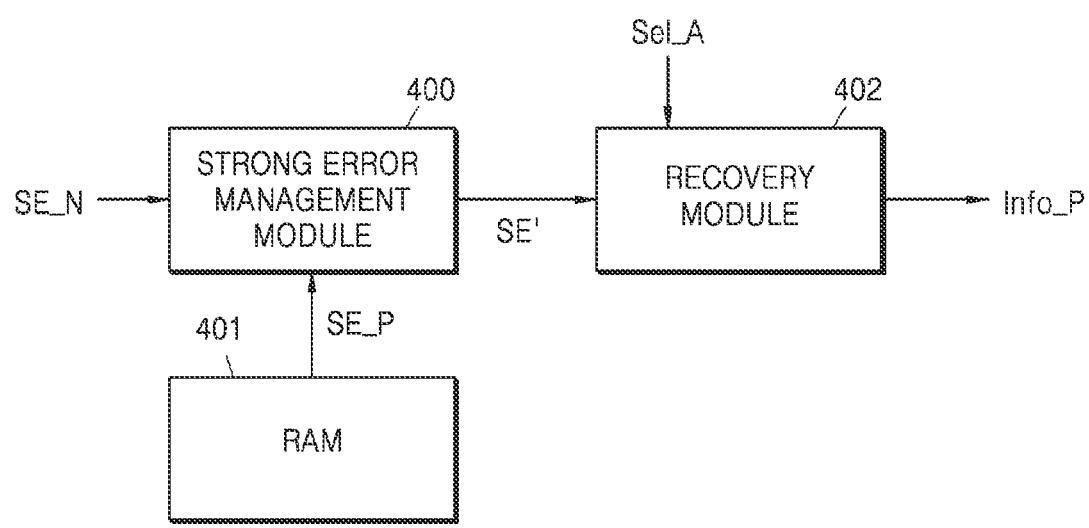

FIGS. 8A and 8B are views illustrating an implementation example of a strong error management module of the disclosure. In an embodiment, various components of the strong error management module may be implemented in hardware, software, or a combination thereof.

Referring to FIG. 8A, a strong error management module 400 may include a strong error determiner 410, an update controller 420, a read reclaim determiner 430, and a recovery algorithm selector 440. The strong error management module 400 may determine the location of a memory cell having a strong error by using hard decision data HD and soft decision data SD in the embodiment described above, and the determination operation as described above may be performed by the strong error determiner 410. In addition, the strong error determiner 410 may determine the number of strong errors for each certain monitoring unit (e.g., page, word line, stripe unit, etc.), based on the determination of the strong error and may determine the degree of deterioration of the memory cells based on the number of strong errors.

The strong error determiner 410 may provide information indicating locations of memory cells having a strong error and information indicating the degree of deterioration, based on the determination described above. The update controller 420 may update strong error information in RAM 401 provided in a memory system (or a memory controller), and accordingly, a location of a memory cell having a strong error that changes over time may be updated. In an embodiment, the operation of updating the strong error information in the RAM 401 may be selectively performed based on the number of strong errors (or the amount of the strong error) and when the number of strong errors in a monitoring unit exceeds a first reference value Ref 1, the update operation may be performed.

In addition, each of the read reclaim determiner 430 and the recovery algorithm selector 440 may perform a management operation for improving data reliability based on deterioration information from the strong error determiner 410. For example, when the degree of deterioration of the memory cells exceeds a certain second reference value Ref 2, the read reclaim determiner 430 determines that there is a possibility of data loss as the deterioration of the memory cells increases and may output a determination result Det_R indicating that a read reclaim is to be performed. In addition, the recovery algorithm selector 440 may output selection information Sel_A indicating a recovery algorithm optimized for the degree of degradation from among various types of recovery algorithms for error recovery according to the degree of degradation of the memory cells.

In the embodiment shown in FIG. 8A, it has been described that the strong error determiner 410 determines the strong error information based on the hard decision data HD and the soft decision data SD, but an embodiment is not limited thereto. For example, when an ECC circuit (not shown) generates strong error information as in the embodiment described above, the function of the strong error determiner 410 in the strong error management module 400 may be removed.

FIG. 8B shows an example of a recovery operation according to an embodiment.

Referring to FIG. 8B, the strong error management module 400 may generate and output third strong error information SE' to be used for error correction, based on first strong error information SE_P already stored in the RAM 401, and second strong error information SE_N generated in response to a data read request from a host. For example, based on the combination of the first strong error information SE_P and the second strong error information SE_N, whether memory cells requested to be read have a strong error may be determined more accurately. For example, as described above, the third strong error information SE' may include information on a deterioration state including a case in which a memory cell predicted to have strong reliability has an actual strong error or vice versa.

A recovery module 402 performs a recovery algorithm according to the selection information Sel_A, and as an example, as a recovery algorithm uses the strong error information, the recovery module 402 may receive the third strong error information SE' from the strong error management module 400. The recovery module 402 may generate various parameters used for error correction based on the LDPC and may generate information Info_P including parameters based on the third strong error information SE' with improved accuracy and provides the information Info_P to an ECC circuit (not shown), so that the error correction capability of the ECC circuit may be improved.

Figure 9:
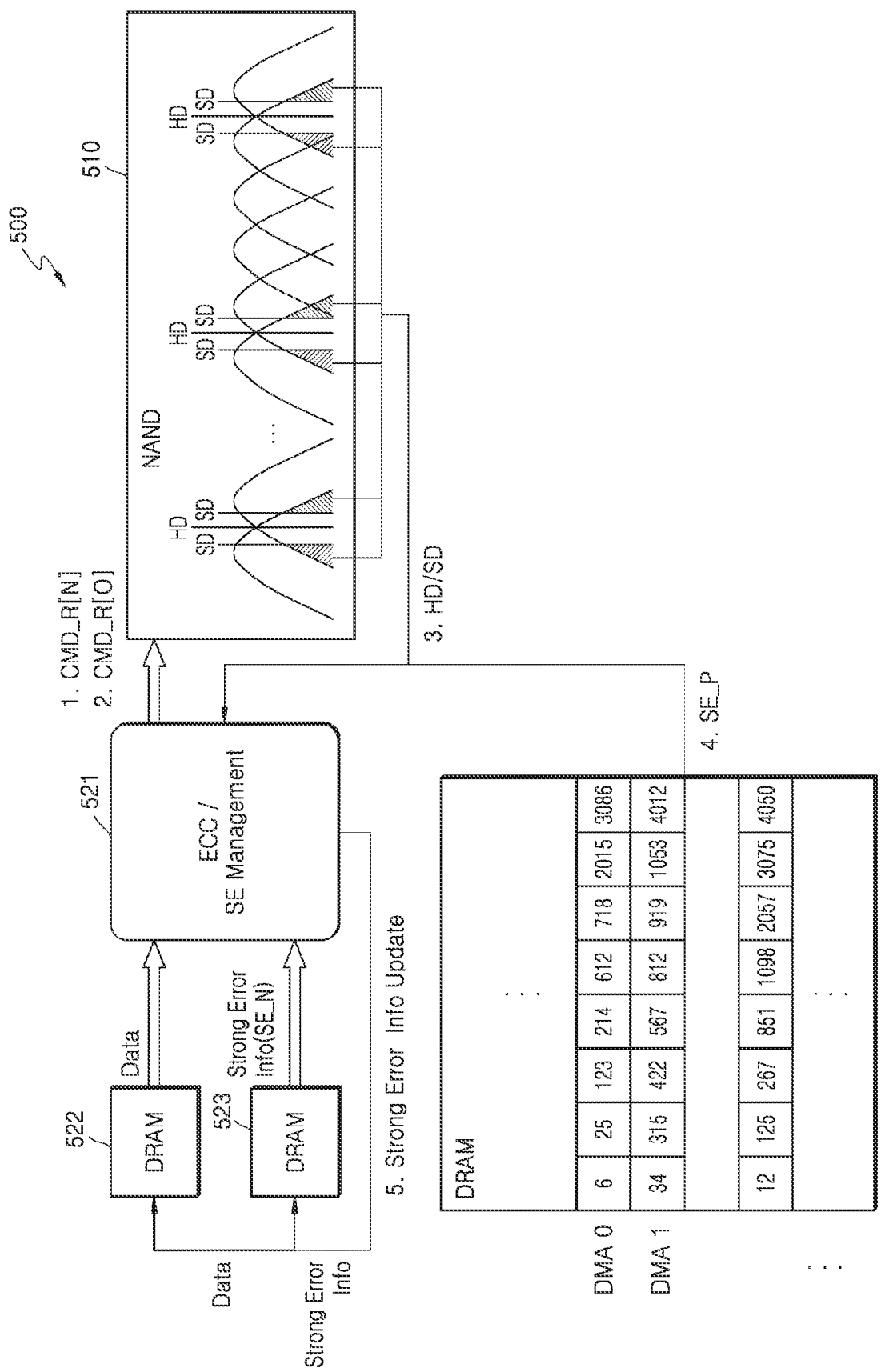
FIG. 9 is a view illustrating an example in which strong error information is used for error correction according to an embodiment.

FIG. 9 is a view illustrating an example in which strong error information is used for error correction according to an embodiment.

Referring to FIG. 9, a memory system 500 may include a memory device 510 and threshold voltage distributions of NAND memory cells are exemplified as an example of the memory device 510. According to the embodiment described above, memory cells may have a plurality of threshold voltage distributions and some of the memory cells may have a strong error according to the level of a threshold voltage.

A memory controller may include components related to error correction and recovery, and an ECC circuit/strong error management module 521 is shown together for convenience of description related to error correction and recovery. According to the embodiment described above, the ECC circuit and the strong error management module may be implemented separately and each may be implemented as hardware, software, or a combination thereof.

The memory controller may collect the hard decision information HD and the soft decision information SD by providing a read command CMD_R[N] using a normal read level and a read command CMD_R[0] using an offset read level to the memory device 510. The ECC circuit/strong error management module 521 may generate strong error information based on the hard decision information HD and the soft decision information SD provided from the memory device 510.

For error correction of data requested to be read from a host, the first strong error information SE_P previously updated and stored in second DRAM 523 in the memory controller may be provided to the ECC circuit/strong error management module 521. The ECC circuit/strong error management module 521 may perform an ECC decoding process based on the strong error information SE_P read from the second DRAM 523 and the second strong error information SE_N generated based on data read from the memory device 510. In addition, data to be provided to the host may be temporarily stored in first DRAM 522 in the memory controller and data read from the first DRAM 522 is provided to the ECC circuit/strong error management module 521 and the errors may be corrected.

In the embodiment illustrated in FIG. 9, information stored in the second DRAM 523 may indicate the location of a memory cell having a strong error in a monitoring unit (e.g., a page). For example, when one page has a size of 16 K, the number shown as information stored in a first row DMA 0 of the second DRAM 523 may indicate the location of each of memory cells having a strong error from among memory cells of the one page.

The ECC circuit/strong error management module 521 may manage an operation of updating periodically or aperiodically collected strong error information to a corresponding location of the second DRAM 523 irrespective of a host's request. In addition, when error correction of data read in response to a request from a host is not possible, the ECC circuit/strong error management module 521 may generate strong error information according to the embodiment described above and update the strong error information in a corresponding location of the second DRAM 523. Based on a result of determining a deterioration state based on the strong error information, a read reclaim may be performed in a unit (e.g., a cell block) including an area from which the data is read. For example, through the read reclaim process, data of the cell block including the area from which the data is read is moved to another cell block. In this case, strong error information corresponding to a corresponding monitoring unit in the second DRAM 523 may be initialized.

Figure 10:
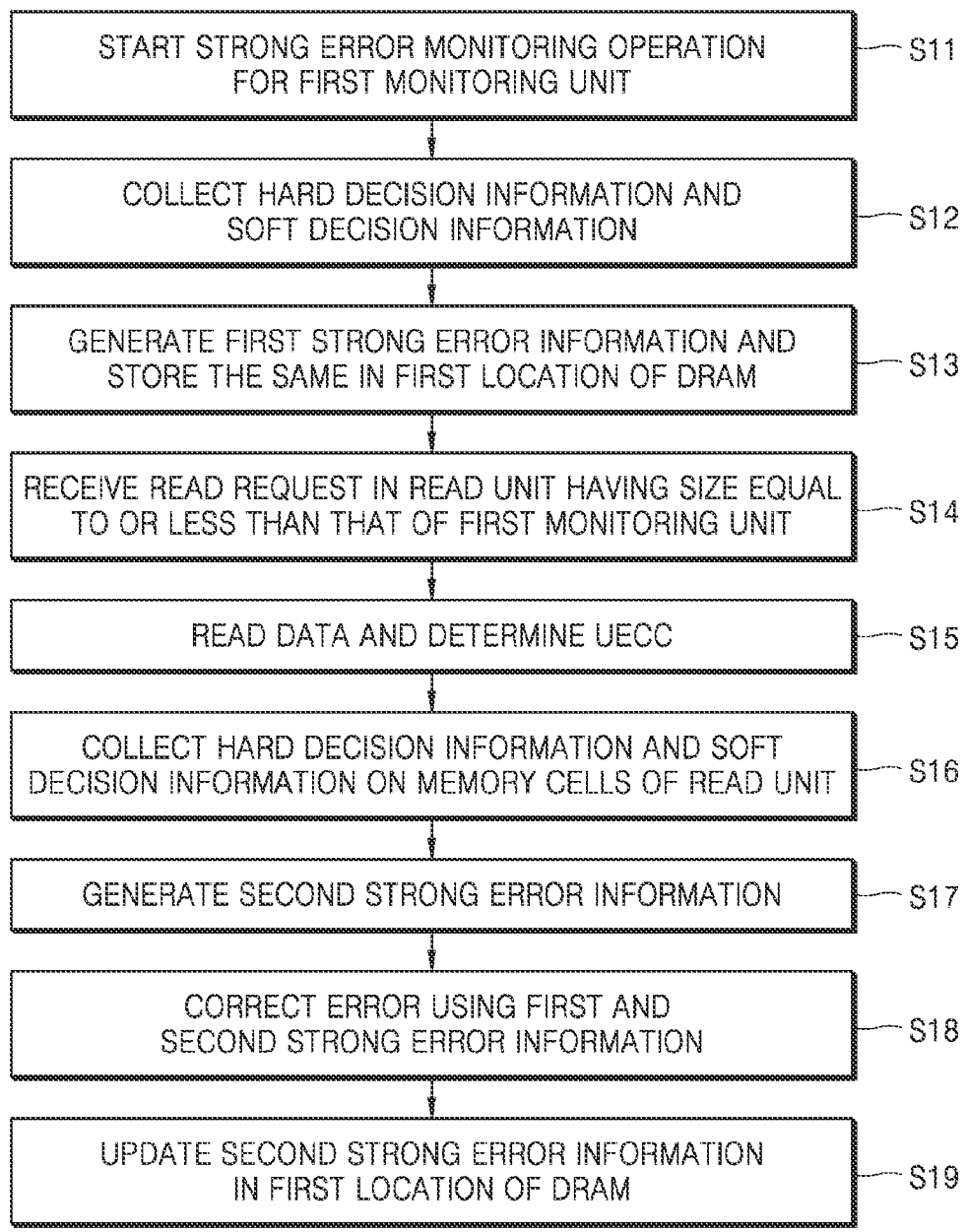
FIG. 10 is a flowchart illustrating a method of operating a memory controller according to an embodiment.

FIG. 10 is a flowchart illustrating a method of operating a memory controller according to an embodiment.

The memory controller included in a memory system controls all operations of a memory device and may perform various control operations for improving data reliability based on strong error information according to embodiments. In operation S11, the memory controller may periodically or aperiodically perform a strong error monitoring operation, and as an example, may start a strong error monitoring operation for a first monitoring unit regardless of a request from a host.

In operation S12, the memory controller may collect hard decision information based on a normal read level and soft decision information based on an offset read level for the first monitoring unit, and in operation S13, may generate first strong error information corresponding to the first monitoring unit according to the embodiments described above. In addition, the first strong error information may be stored in DRAM provided in the memory controller, and as an example, may be stored in a first location of the DRAM corresponding to the first monitoring unit.

In operation S14, the memory system may receive a read request from the host, and a read unit according to the read request may have a size equal to or less than that of the first monitoring unit. In operation S15, data of the read unit may be read in response to the read request from the host, and it may be determined whether there is an uncorrectable error UECC through an error correction operation.

In operation S16, because the uncorrectable error UECC exists, an operation of collecting hard decision information and soft decision information on memory cells of the read unit may be performed. In operation S17, second strong error information may be generated based on the received hard decision information and soft decision information. For example, when a monitoring unit is greater than a read unit (e.g., when a monitoring unit corresponds to a unit of multiple pages), because the first strong error information stored in the DRAM shares reliability information in a relatively large unit, it is possible to increase the accuracy of the location of a memory cell having a strong error from among the memory cells of the read unit. In addition, in operation S18, because error correction is performed based on the combination of the previously stored first strong error information and the newly generated second strong error information, the possibility of error correction may be improved. The newly generated second strong error information may be updated in the DRAM in operation S19. For example, the location of the memory cell having a strong error indicated by the first strong error information may be changed and added by the second strong error information.

Figure 11A:
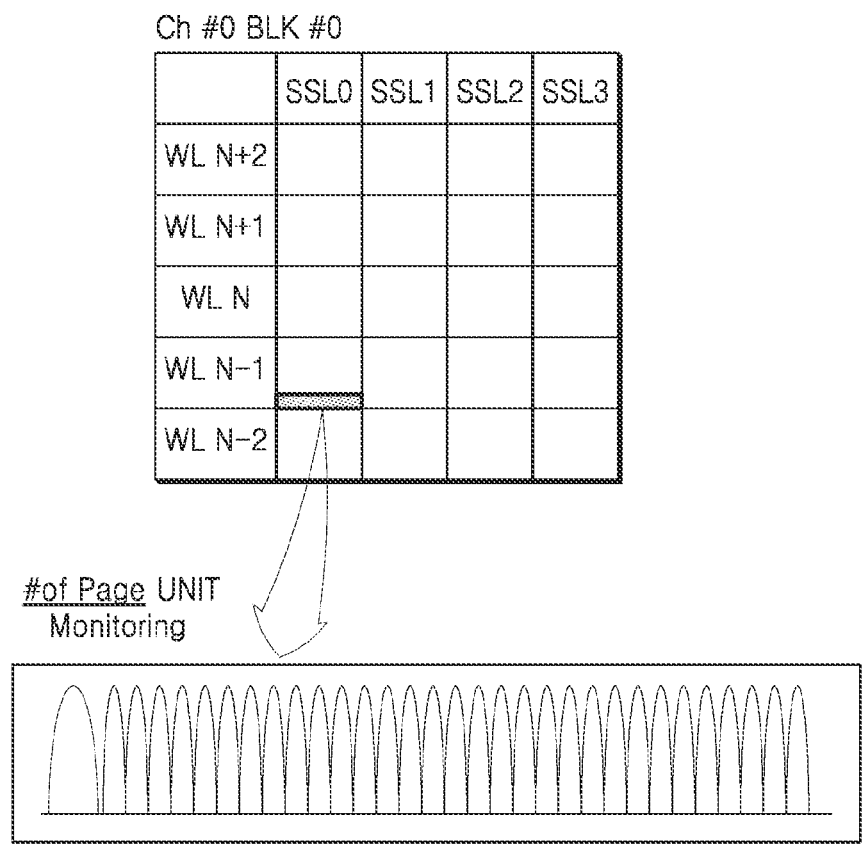
FIGS. 11A, 11B, and 11C are views illustrating a monitoring unit according to an embodiment.
Figure 11B:
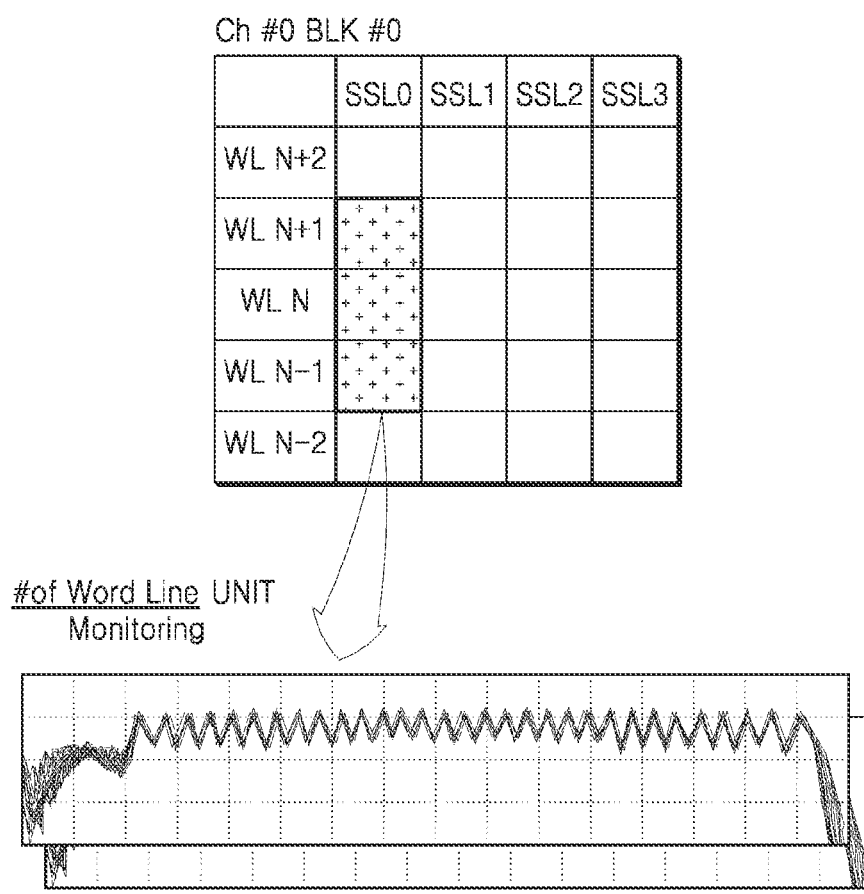
Figure 11C:
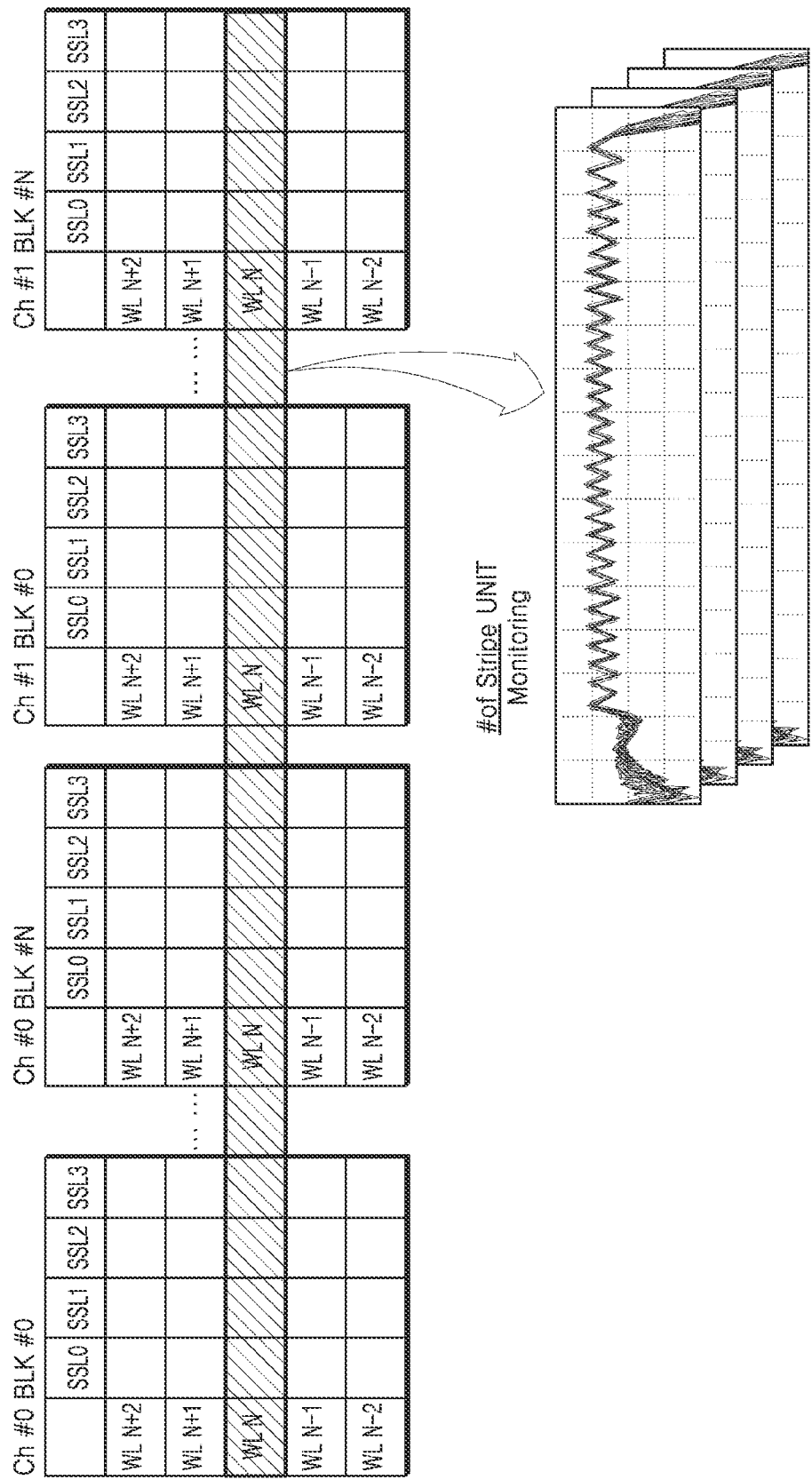

FIGS. 11A, 11B, and 11C are views illustrating a monitoring unit according to an embodiment.

A memory cell array of a memory device may include a plurality of cell blocks, and each cell block may include a plurality of cell strings. In FIGS. 11A, 11B, and 11C, first to fourth string selection lines SSL0 to SSL3 are exemplified, and each of the string selection lines may be shared by a plurality of cell strings. For example, because a first string selection signal provided to the first string selection line SSL0 is activated, a plurality of cell strings sharing the first string selection line SSL0 may be selected.

Each cell string may be connected to a plurality of word lines (e.g., WL N−2 to WL N+2), a plurality of memory cells may be connected to each word line, and each word line may be shared by a plurality of cell strings. For example, when the first string selection signal is activated and the word line WL N is selected from among the plurality of word lines WL N−2 to WL N+2, memory cells connected to the word line WL N may be selected from the cell strings connected to the first string selection line SSL0.

In addition, each memory cell may store a number of bits, and when the memory cell corresponds to a PLC, each memory cell may store 5 bits of data. In the example shown in FIG. 11A, when data read from the memory cells connected to the word line WL N constitutes one page and the memory cell corresponds to the PLC, the memory cells connected to the word line WL N may store data corresponding to five pages.

According to an embodiment, a monitoring unit for collecting strong error information may be set to various groups. For example, the monitoring unit may be a unit that shares reliability information when performing error correction and data reliability may be improved by collecting strong error information based on the monitoring unit and using the strong error information for error correction. In the example shown in FIG. 11A, a case in which one page constitutes a monitoring unit is illustrated.

On the other hand, according to embodiments, as shown in FIG. 11B, one or more word lines may constitute a monitoring unit. For example, when memory cells connected to one word line in the cell strings connected to the first string selection line SSL0 constitute a monitoring unit, a size corresponding to five pages may constitute the monitoring unit. Alternatively, when two or more word lines (e.g., the word line WL N−1 to word line WL N+1) constitute a monitoring unit, pages included in the two or more word lines may constitute the monitoring unit.

As shown in FIG. 11C, a monitoring unit may include memory cells of a plurality of cell blocks provided in a plurality of channels. For example, a memory system may include a plurality of memory devices connected to the memory controller through a plurality of channels and each memory device may include one or more memory chips (e.g., flash memory chips).

Data stored in two or more memory devices may constitute a unit of a recovery operation for error recovery, and a monitoring unit related to collection of strong error information may correspond to the recovery unit. For example, pages or word lines of a plurality of cell blocks included in at least two memory devices may constitute one monitoring unit and a unit including the pages or word lines of the plurality of cell blocks may be defined as a stripe. For example, in a plurality of cell blocks, a stripe including one or more pages of each block may constitute a monitoring unit of a strong error in the embodiment described above.

According to the embodiment as described above, the monitoring unit of the strong error may be changed to various sizes. For example, when the monitoring unit is relatively large, the size of the unit sharing reliability information increases and in a recovery algorithm process, the accuracy of strong error information corresponding to a read unit may be improved by referring to strong error information corresponding to a plurality of other read units sharing the reliability information. Accordingly, the possibility of error correction using the strong error information may be increased.

Figure 12:
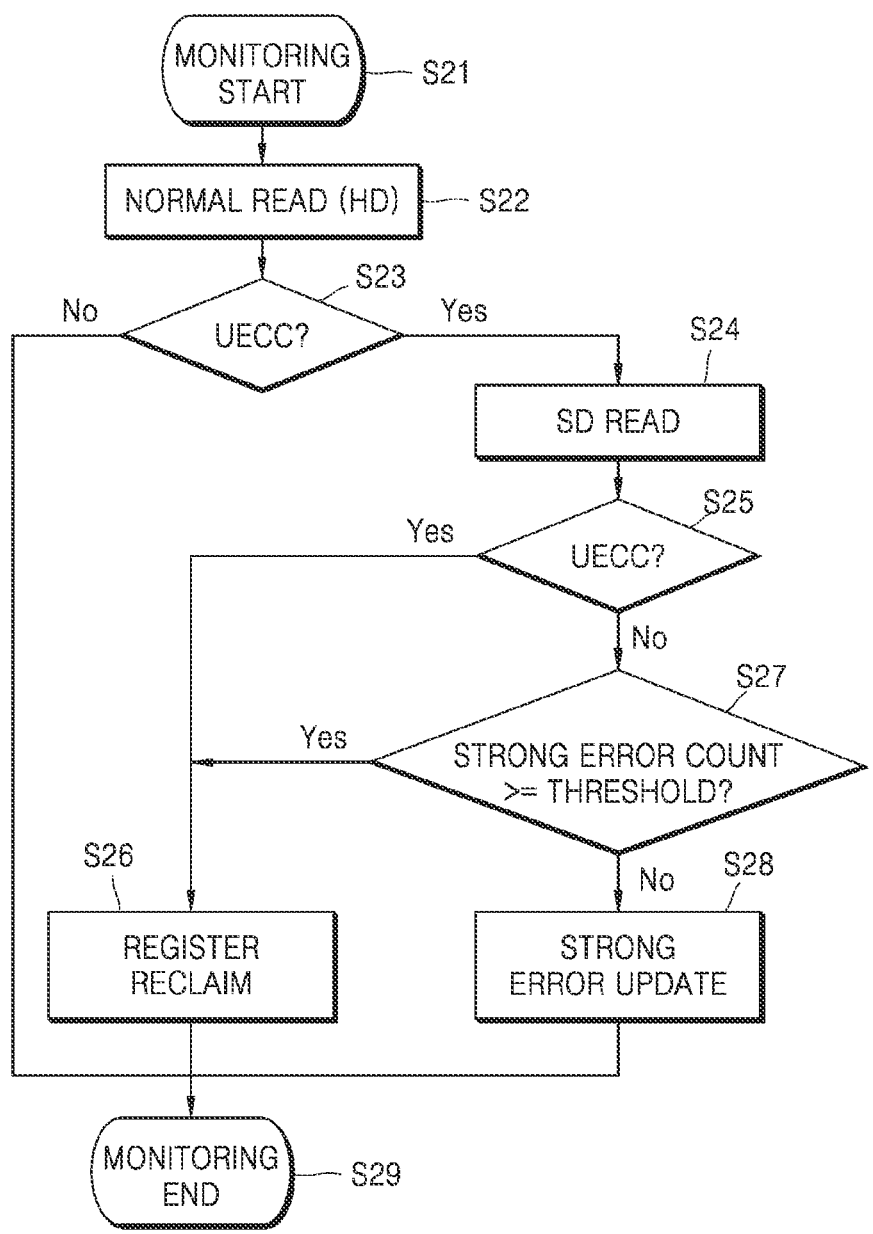
FIG. 12 is a flowchart illustrating a specific operation example of a memory system according to an embodiment.

FIG. 12 is a flowchart illustrating a specific operation example of a memory system according to an embodiment.

Referring to FIG. 12, in operation S21, the memory system may start monitoring strong errors independent of a request from a host and in operation S22, a read operation using a normal read level may be performed on memory cells of a certain monitoring unit. In operation S23, a memory controller, by performing ECC decoding processing on read data, may determine whether the read data includes the uncorrectable error UECC. As a result of the determination, in operation S29, when there is no uncorrectable error UECC, it is determined that error correction of the memory cells of the monitoring unit is possible, so the monitoring operation may be terminated without performing an additional operation for updating strong error information.

On the other hand, when the uncorrectable error UECC exists in the read data, in operation S24, a read operation using an offset read level may be performed to collect soft decision information and in operation S25, it may be determined whether error correction is possible by further using the soft decision information. In the embodiment of FIG. 12, a case in which data read according to the read operation is used as hard decision information is exemplified. However, as in the embodiment described above, hard decision information may be collected again using a normal read level.

Because of the determination, in operation S26, when the uncorrectable error UECC exists, it is determined that the deterioration of the memory cells of the monitoring unit is large, and accordingly, an area including the monitoring unit may be registered as a read reclaim target. As an example of an operation, when a read reclaim operation is performed by copying data in units of cell blocks to another cell block, a cell block including the monitoring unit may be registered as a read reclaim target. In addition, in operation S29, the monitoring operation may be terminated after the registration as a read reclaim target for the monitoring unit is completed. Thereafter, the read reclaim operation may be performed at an arbitrary point in time.

On the other hand, when an error may be corrected using the hard decision information and the soft decision information, the number of memory cells having a strong error in the monitoring unit may be determined through strong error information that may be determined based on the hard decision information and the soft decision information. In operation S27, it can be determined whether a result of counting the number of strong errors exceeds a certain threshold, and in operation S26, when the number of strong errors exceeds the threshold, it can be determined that the deterioration of the memory cells of the monitoring unit is large, and thus, an area including the monitoring unit may be registered as a read reclaim target. On the other hand, in operation S28, when the number of strong errors does not exceed the threshold, the newly determined strong error information may be updated in a memory and the updated strong error information may be used in a subsequent error correction process.

Figure 13:
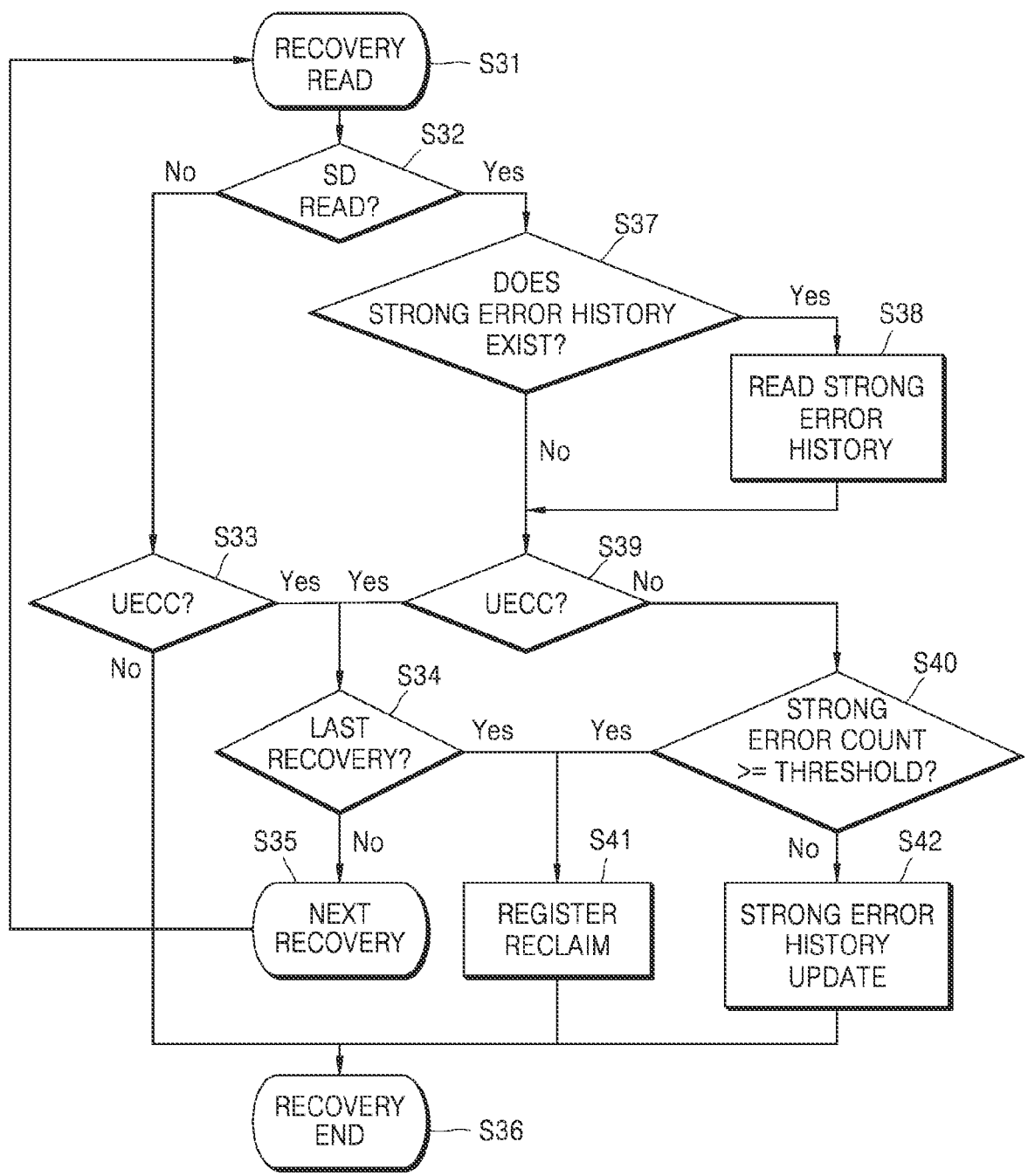
FIG. 13 is a flowchart illustrating a specific operation example of a memory system according to another embodiment.

FIG. 13 is a flowchart illustrating a specific operation example of a memory system according to another embodiment. FIG. 13 illustrates an example of performing strong error management through a read operation in response to a request from a host.

Referring to FIG. 13, in operation S31, a recovery algorithm may be performed as an uncorrectable error occurs in data read according to the request from the host and a read operation may be performed while the recovery algorithm is being performed. In operation S32, it may be determined whether the read operation is an operation related to hard decision information or an operation related to soft decision information. In operation S33, a read operation using a normal read level may be first performed according to a request of the host, and accordingly, it may be determined whether an error in the read data cannot be corrected. In operation S36, if the data error is corrected (i.e., an outcome of NO uncorrectable data), the read operation may be terminated without performing an additional operation (e.g., a recovery operation).

In operation S37, when the read operation corresponds to an operation for collecting the soft decision information using an offset read level, it may be determined whether strong error information (e.g., strong error history) corresponding to a unit in which the read operation is performed exists. In operation S38, if there is strong error history, in order to use strong error history information during an error correction operation on read data, the strong error history information stored in a memory (e.g., DRAM) may be read.

In operation S39, strong error information may be newly generated through the collected information and it may be determined whether error correction is impossible based on the newly generated strong error information and the strong error history information read from the memory. In operation S40, if error correction is possible (i.e., NO uncorrectable data exists), it may be determined whether the number of memory cells having a strong error exceeds a certain threshold based on the newly generated strong error information. In operation S41, if the number of memory cells having a strong error exceeds the threshold, a read reclaim may be registered in an area (e.g., a cell block) including the read data. On the other hand, in operation S42, if the number of memory cells having a strong error does not exceed the threshold, the previously determined strong error information may be updated in the memory.

When an uncorrectable error occurs in the error correction operation using the hard decision information and/or the soft decision information, a recovery operation for error recovery may be repeatedly performed, and as an example, the recovery operation may be repeatedly performed while changing a read level for distinguishing the threshold voltage distribution. In operation S34, when an uncorrectable error occurs, it may be determined whether the current recovery operation is the last recovery operation, and in operation S35, when the current recovery operation is not the last recovery operation, a read operation for the next recovery operation may be started. On the other hand, in operation S41, when the current recovery operation corresponds to the last recovery operation, the recovery operation may be terminated and a read reclaim may be registered for the area including the read data.

Figure 14:
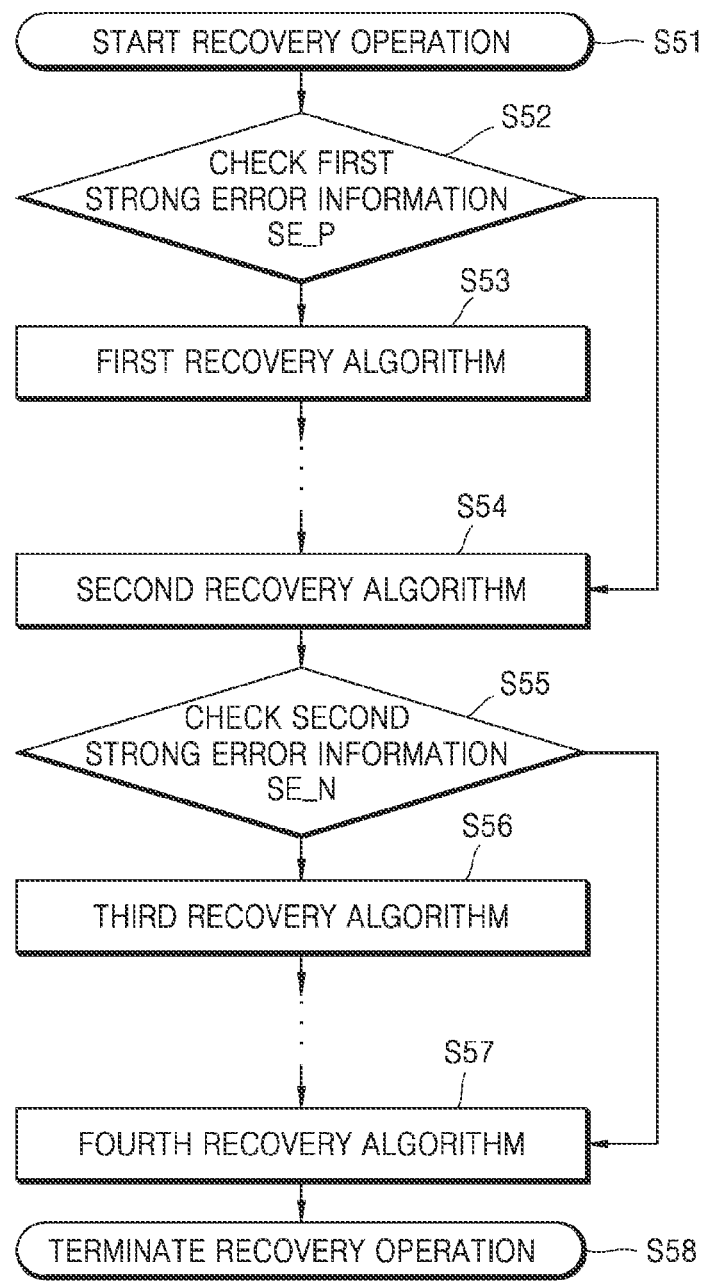
FIG. 14 is a flowchart illustrating a specific operation example of a memory controller according to another embodiment.

FIG. 14 is a flowchart illustrating a specific operation example of a memory controller according to another embodiment. FIG. 14 shows an example of optimal selection of a recovery algorithm based on strong error information.

In operation S51, in response to a read request from a host, an uncorrectable error occurs in read data, and thus, a recovery operation may be started, and in operation S52, the memory controller (or a memory system) may check the first strong error information SE_P corresponding to read-requested data that is previously stored in an internal memory of the memory controller. For example, according to a result of the check, it may be determined whether the number or ratio of memory cells having a strong error is greater than a certain threshold value.

The memory controller may attempt to recover an error based on various types of recovery algorithms. Although first to fourth recovery algorithms are illustrated in FIG. 14, an embodiment is not limited thereto and a selection operation for more recovery algorithms may be possible. In addition, the first recovery algorithm may relatively consume the smallest resource and time, while the fourth recovery algorithm may relatively consume the largest resource and time. For example, the first recovery algorithm may have a characteristic of recovering an error through a small resource that does not use soft decision and strong error information, whereas the second recovery algorithm may have a characteristic of recovering an error using soft decision and strong error information.

In operation S53, according to the result of the check of operation S52, the memory controller may select the first recovery algorithm when the number of strong errors is relatively small, whereas in operation S54, the memory controller may select the second recovery algorithm when the number of strong errors is relatively large. In addition, when an error is not recovered even though the memory controller selects and executes the first recovery algorithm, the second recovery algorithm may be sequentially selected.

In operation S55, when an error is not recovered by the execution of the second recovery algorithm, the memory controller may check the second strong error information SE_N generated by the execution of the second recovery algorithm. Because the second strong error information SE_N corresponds to relatively recently generated information, the second strong error information SE_N may have higher accuracy than that of the first strong error information SE_P. In operation S56, according to a result of the check of operation S55, the memory controller may select the third recovery algorithm when the number of strong errors is relatively small, whereas in operation S57, the memory controller may select the fourth recovery algorithm when the number of strong errors is relatively large. The fourth recovery algorithm may consume more resources than the third recovery algorithm. As an embodiment, the third recovery algorithm may correspond to an algorithm for searching for a valley between threshold voltage distributions, and the fourth recovery algorithm may correspond to an algorithm (e.g., a redundant array of independent disks (RAID)) that reads data other than the read-requested data from a host and recovers an error using the data. In operation S58, when the error is recovered by the recovery algorithm as described above, the recovery operation may be terminated.

Figure 15:
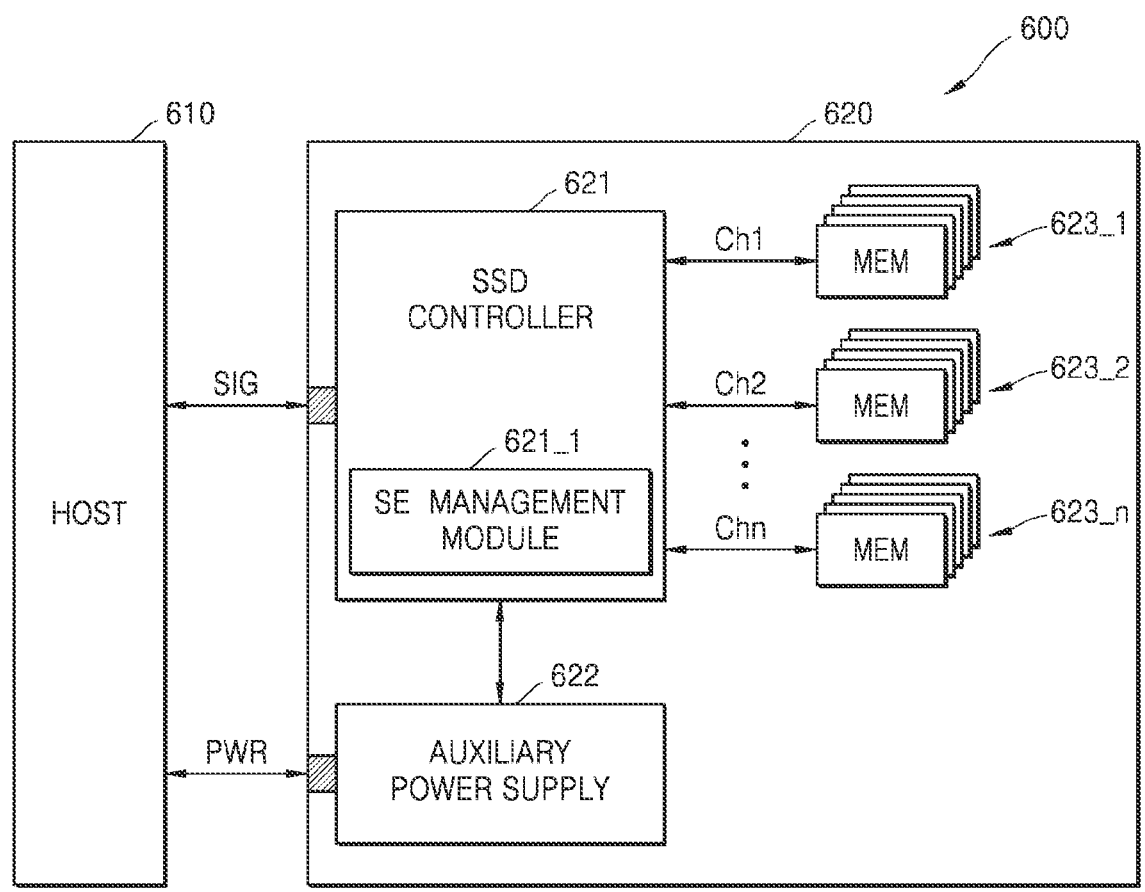
FIG. 15 is a block diagram illustrating an example in which a memory system according to embodiments is applied to an SSD system.

FIG. 15 is a block diagram illustrating an example in which a memory system according to embodiments is applied to an SSD system.

Referring to FIG. 15, an SSD system 600 may include a host 610 and an SSD 620. The SSD 620 may transmit and receive signals to and from the host 610 through a signal connector SIG and may receive power through a power connector PWR. The SSD 620 may include an SSD controller 621, an auxiliary power supply 622, and nonvolatile memory devices 623_1 to 623_n. The nonvolatile memory devices 623_1 to 623_n may include NAND flash memories. In this case, the SSD 620 may be implemented using the embodiments described above with reference to FIGS. 1 to 14.

For example, the SSD controller 621 provided in the SSD 620 may include a strong error management module 621_1 and an ECC circuit (not shown) according to the embodiments described above, wherein the ECC circuit may perform an error correction operation based on hard decision data and/or soft decision data received from the nonvolatile memory devices 623_1 to 623_n and the strong error management module 621_1 may manage strong error information according to the embodiments described above. In addition, based on the control by the strong error management module 621_1, the SSD controller 621 may periodically or aperiodically update the strong error information and may use the updated strong error information for ECC decoding processing. In addition, based on the control by the strong error management module 621_1, the SSD controller 621 may determine the degree of deterioration of memory cells based on the strong error information, may determine whether to perform a read reclaim according to a result of the determination, or may perform a management operation such that a recovery algorithm optimized for the degree of deterioration from among various types of recovery algorithms is performed.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

Embodiments have been illustrated and described in the drawings and the detailed description as described above. Although the specific terms are used to explain these example embodiments in the present disclosure, the specific terms are not intended to restrict the scope of the disclosure and are only used for a better understanding of the disclosure. It will be understood by those of ordinary skill in the art that various changes in form and details may be made without departing from the spirit and scope of the invention as defined by the appended claims. Therefore, the scope of the present disclosure is defined not by the detailed description of the present disclosure but by the appended claims.

While the disclosure has been particularly shown and described with reference to embodiments thereof, it will be understood that various changes in form and details may be made therein without departing from the spirit and scope of the following claims.

What is claimed is:

1. A method of operating a memory controller for controlling a memory device, the method comprising:
designating one or more cells of a memory cell array as a monitoring unit;
collecting hard decision information based on data read from memory cells of the monitoring unit using a normal read level;
collecting soft decision information based on data read from the monitoring unit using one or more offset read levels that are different from the normal read level;
storing first strong error information determined based on the hard decision information and the soft decision information in a memory in the memory controller; and updating second strong error information determined for the monitoring unit in the memory after the first strong error information is stored, wherein the second strong error information is used to correct an error in data read in response to a read request from a host.

2. The method of claim 1, wherein:

the one or more offset read levels comprise a first offset read level that is greater than the normal read level by a first level and a second offset read level that is less than the normal read level by a second level, and the soft decision information comprises data read using the first offset read level and the second offset read level.

3. The method of claim 1, wherein a memory in the memory controller includes dynamic random access memory (DRAM).

4. The method of claim 1, wherein the updating of the second strong error information is performed independently by the memory controller regardless of the read request from the host.

5. The method of claim 1, wherein each of the memory cells includes a quad-level cell (QLC) that stores 4-bit data or a penta-level cell (PLC) that stores 5-bit data.

6. The method of claim 1, wherein:

the second strong error information is generated by collecting the hard decision information and the soft decision information when an uncorrectable error exists in the data read in response to the read request from the host, and in correcting an error of the data read in response to the read request from the host, the first strong error information and the second strong error information are used together.

7. The method of claim 6, wherein the monitoring unit includes a unit requested to be read by the host.

8. The method of claim 7, wherein the monitoring unit corresponds to any one of a page unit included in one cell block of the memory device, a word line unit included in the cell block, and a stripe unit including pages of a plurality of cell blocks of the memory device.

9. The method of claim 6, wherein the memory controller:

executes a plurality of recovery algorithms that consume different resources, and selects a recovery algorithm for correcting an error of the data, read in response to the read request from the host, from among the plurality of recovery algorithms based on at least one of the first strong error information and the second strong error information.

10. The method of claim 1, further comprising determining whether to perform a read reclaim on a cell block including the monitoring unit based on at least one of the first strong error information and the second strong error information.

11. The method of claim 1, wherein the first strong error information or the second strong error information comprises information indicating locations of memory cells having a strong error in the monitoring unit.

12. The method of claim 1, wherein the updating of the second strong error information is selectively performed when a number of memory cells having a strong error determined according to the second strong error information exceeds a certain threshold value.

13. A method of operating a memory controller for controlling a memory device, the method comprising:

designating one or more cells of a memory cell array as a monitoring unit;

collecting hard decision information based on data read from memory cells using a normal read level;

collecting soft decision information based on data read from the memory cells using one or more offset read levels that are different from the normal read level;

storing first strong error information determined based on the hard decision information and the soft decision information in a memory in the memory controller;

as an uncorrectable error occurs in data read in response to a read request from a host, generating second strong error information based on the hard decision information and the soft decision information collected by re-reading the memory cells; and correcting an error in the data read in response to the read request using the first strong error information and the second strong error information.

14. The method of claim 13, further comprising updating the second strong error information to the memory.

15. The method of claim 13, wherein the storing of the first strong error information in the memory is performed by the memory controller regardless of the read request from the host.

16. The method of claim 13, wherein when a number of memory cells having a strong error, determined according to the second strong error information, exceeds a certain threshold, a read reclaim is performed on a cell block including a unit corresponding to the read request from the host.

17. The method of claim 13, wherein the memory controller:

executes a plurality of recovery algorithms that consume different resources, and selects a recovery algorithm for correcting an error of the data, read in response to the read request from the host, from among the plurality of recovery algorithms based on at least one of the first strong error information and the second strong error information.

18. A memory controller comprising:

a processor configured to control a memory operation for a memory device and to designate one or more cells of a memory cell array of the memory device as a monitoring unit;

an error correcting code (ECC) circuit configured to perform an error correction operation on data read from the memory device, to generate first strong error information based on hard decision information collected using a normal read level and soft decision information collected using one or more offset read levels for the monitoring unit of the memory device, and to generate second strong error information based on the hard decision information and the soft decision information collected again for the monitoring unit in response to a read request from a host; and a volatile memory configured to store the first strong error information or the second strong error information, wherein:

the normal read level and the offset read levels have different values, and the ECC circuit corrects an error of data requested to be read from the host by using the first strong error information and the second strong error information.

19. The memory controller of claim 18, further comprising a strong error management module configured to select a recovery algorithm used for error correction of the memory device or determine whether to perform a read reclaim on a cell block including the monitoring unit, based on at least one of the first strong error information and the second strong error information.

20. The memory controller of claim 19, wherein the strong error management module is configured to control an operation of storing the first strong error information in the volatile memory and then update the second strong error information in the volatile memory.

* * * * *